(12) United States Patent
Sipes, Jr. et al.

(10) Patent No.: US 9,343,868 B2
(45) Date of Patent: May 17, 2016

(54) EFFICIENT GENERATION OF INTENSE LASER LIGHT FROM MULTIPLE LASER LIGHT SOURCES USING MISALIGNED

(71) Applicant: OPTICAL ENGINES, INC., Colorado Springs, CO (US)

(72) Inventors: Donald L. Sipes, Jr., Colorado Springs, CO (US); Daniel Scott Schulz, Colorado Springs, CO (US)

(73) Assignee: OPTICAL ENGINES INC., Colorado Springs, CO (US)

( * ) Notice: Subject to any disclaimer, the term of this patent is extended or adjusted under 35 U.S.C. 154(b) by 52 days.

(21) Appl. No.: 14/012,858

(22) Filed: Aug. 28, 2013

(65) Prior Publication Data
US 2014/0064305 A1    Mar. 6, 2014

Related U.S. Application Data

(60) Provisional application No. 61/693,973, filed on Aug. 28, 2012.

(51) Int. Cl.
*G02B 6/42* (2006.01)
*G02B 6/32* (2006.01)
(Continued)

(52) U.S. Cl.
CPC .............. *H01S 3/10* (2013.01); *G02B 19/0014* (2013.01); *G02B 19/0057* (2013.01); *H01S 5/4012* (2013.01); *H01S 5/005* (2013.01); *H01S 5/02284* (2013.01); *H01S 5/405* (2013.01)

(58) Field of Classification Search
CPC ........... G02B 19/0014; G02B 19/0057; G02B 2006/12102; H01S 3/067; H01S 3/10; H01S 5/4025; H01S 5/4012
USPC .............................. 372/6, 9, 29.014, 50.23, 75
See application file for complete search history.

(56) References Cited

U.S. PATENT DOCUMENTS

| 5,139,609 A | 8/1992 | Fields et al. |
| 5,185,758 A | 2/1993 | Fan et al. |

(Continued)

FOREIGN PATENT DOCUMENTS

| EP | 1 059 713 A2 | 12/2000 |
| EP | 1 359 443 A | 5/2003 |

(Continued)

OTHER PUBLICATIONS

Response to Written Opinion filed on Nov. 12, 2007 for co-pending International Application No. PCT/US2006/045210 (10 pages).
(Continued)

*Primary Examiner* — Kaveh C Kianni
*Assistant Examiner* — Hung Lam
(74) *Attorney, Agent, or Firm* — Leydig, Voit & Mayer, Ltd.

(57) ABSTRACT

A system is provided for combining laser light sources. The system includes: a stack of laser diode bar arrays, comprising two or more laser diode bar arrays, each laser diode bar array having multiple laser diodes; a multimode optical fiber; and a plurality of optical elements disposed between the stack of laser diode bar arrays and the multimode optical fiber, configured to direct light from the stack of laser diode bar arrays to the multimode optical fibers, the plurality of optical elements further including: a plurality of fast-axis collimating (FAC) lenses, wherein at least one FAC lens of the plurality of FAC lenses corresponds to each laser diode bar array. At least one FAC lens of the plurality of FAC lenses is misaligned with respect to the corresponding laser diode bar array. At least one misaligned FAC lens has at least one of a translational position and a orientation relative to its corresponding laser diode bar array different from another FAC lens of the plurality of FAC lenses relative to its corresponding laser diode bar array.

9 Claims, 9 Drawing Sheets

(51) Int. Cl.
*H01S 3/10* (2006.01)
*H01S 5/40* (2006.01)
*G02B 19/00* (2006.01)
*H01S 5/00* (2006.01)
*H01S 5/022* (2006.01)

(56) References Cited

U.S. PATENT DOCUMENTS

| | | | |
|---|---|---|---|
| 5,212,707 | A | 5/1993 | Heidel et al. |
| 5,229,883 | A | 7/1993 | Jackson et al. |
| 5,243,619 | A | 9/1993 | Albers et al. |
| 5,333,077 | A | 7/1994 | Legar et al. |
| 5,374,935 | A | 12/1994 | Forrest |
| 5,568,577 | A | 10/1996 | Hardy, Jr. |
| 5,579,422 | A | 11/1996 | Head et al. |
| 5,594,752 | A | 1/1997 | Endriz |
| 5,790,310 | A | 8/1998 | Huang |
| 5,793,783 | A | 8/1998 | Endriz |
| 5,802,092 | A | 9/1998 | Endriz |
| 5,805,748 | A | 9/1998 | Izawa |
| 5,887,096 | A | 3/1999 | Du et al. |
| 6,028,722 | A | 2/2000 | Lang |
| 6,101,199 | A | 8/2000 | Wang et al. |
| 6,104,741 | A | 8/2000 | Igarashi et al. |
| 6,151,168 | A | 11/2000 | Goering et al. |
| 6,222,864 | B1 | 4/2001 | Waarts et al. |
| 6,377,410 | B1 | 4/2002 | Wang et al. |
| 6,404,542 | B1 | 6/2002 | Ziari et al. |
| 6,556,352 | B2 | 4/2003 | Wang et al. |
| 6,666,590 | B2 | 12/2003 | Brosnan |
| 6,683,727 | B1 | 1/2004 | Goring et al. |
| 6,778,732 | B1 * | 8/2004 | Fermann ............... 385/31 |
| 6,950,573 | B2 | 9/2005 | Ota et al. |
| 7,010,194 | B2 | 3/2006 | Anikitchev et al. |
| 7,079,566 | B2 | 7/2006 | Kido et al. |
| 7,773,653 | B2 | 8/2010 | Voss et al. |
| 2003/0099267 | A1 | 5/2003 | Henning et al. |
| 2003/0118291 | A1 * | 6/2003 | Brosnan ............... 385/89 |
| 2003/0214571 | A1 | 11/2003 | Ishikawa et al. |
| 2003/0223685 | A1 | 12/2003 | Hasgawa et al. |
| 2005/0063435 | A1 | 3/2005 | Imai et al. |
| 2006/0018356 | A1 | 1/2006 | Voss et al. |
| 2007/0195850 | A1 | 8/2007 | Schluter et al. |
| 2008/0019010 | A1 | 1/2008 | Govorkov et al. |
| 2013/0028276 | A1 * | 1/2013 | Minelly et al. ............... 372/6 |

FOREIGN PATENT DOCUMENTS

| | | |
|---|---|---|
| EP | 1 619 765 A1 | 1/2006 |
| EP | 1 972 043 B1 | 11/2014 |
| JP | 10-325941 A | 12/1998 |
| JP | 2000-098191 | 4/2000 |
| JP | 2002148491 A | 5/2002 |
| JP | 2003-344721 A | 12/2003 |
| JP | 2005-238859 A | 9/2005 |
| JP | 2005-283862 A | 10/2005 |
| JP | 2011501777 A | 2/2011 |
| WO | WO 98/13910 A1 | 4/1998 |
| WO | WO 02/50599 | 6/2002 |

OTHER PUBLICATIONS

Preliminary Report on Patentability dated Aug. 2, 2008 for International Application Serial No. PCT/US2006/045210 (11 pages).
Official Action dated Feb. 16, 2012 from co-pending Japanese Patent Application No. 2008-545615.
Examination Report Dated Aug. 31, 2009 for co-pending European application No. 06838278.7 (2 pages).
Fan, T.Y., et al., *"Scalable, end-pumped, diode-laser-pumped laser"*, Optics Letters, 14 1057 (1989) (5 pages).
Fan, T.Y., et al., *"Pump Source Requirements for End-Pumped Laser"*, IEEE *Journal of Quantum Electronics*, 26, 311 (1990) (8 pages).
Leger, James R., *"Microoptical Components Applied to Incoherent and Coherent Laser Arrays"*. Chapter 3, pp. 123-179, from book entitled *"Diode Laser Arrays"*, Cambridge Studies in Modern Optics, Edited by D. Botez, et al., (1994) (67 pages).
Response to Examination Report dated Mar. 10, 2010 for co-pending European Application No. 06838278.7 (17 pages).
Official action dated Nov. 28, 2013 for co-pending Japanese Application No. 2008-545615 (11 pages).

* cited by examiner

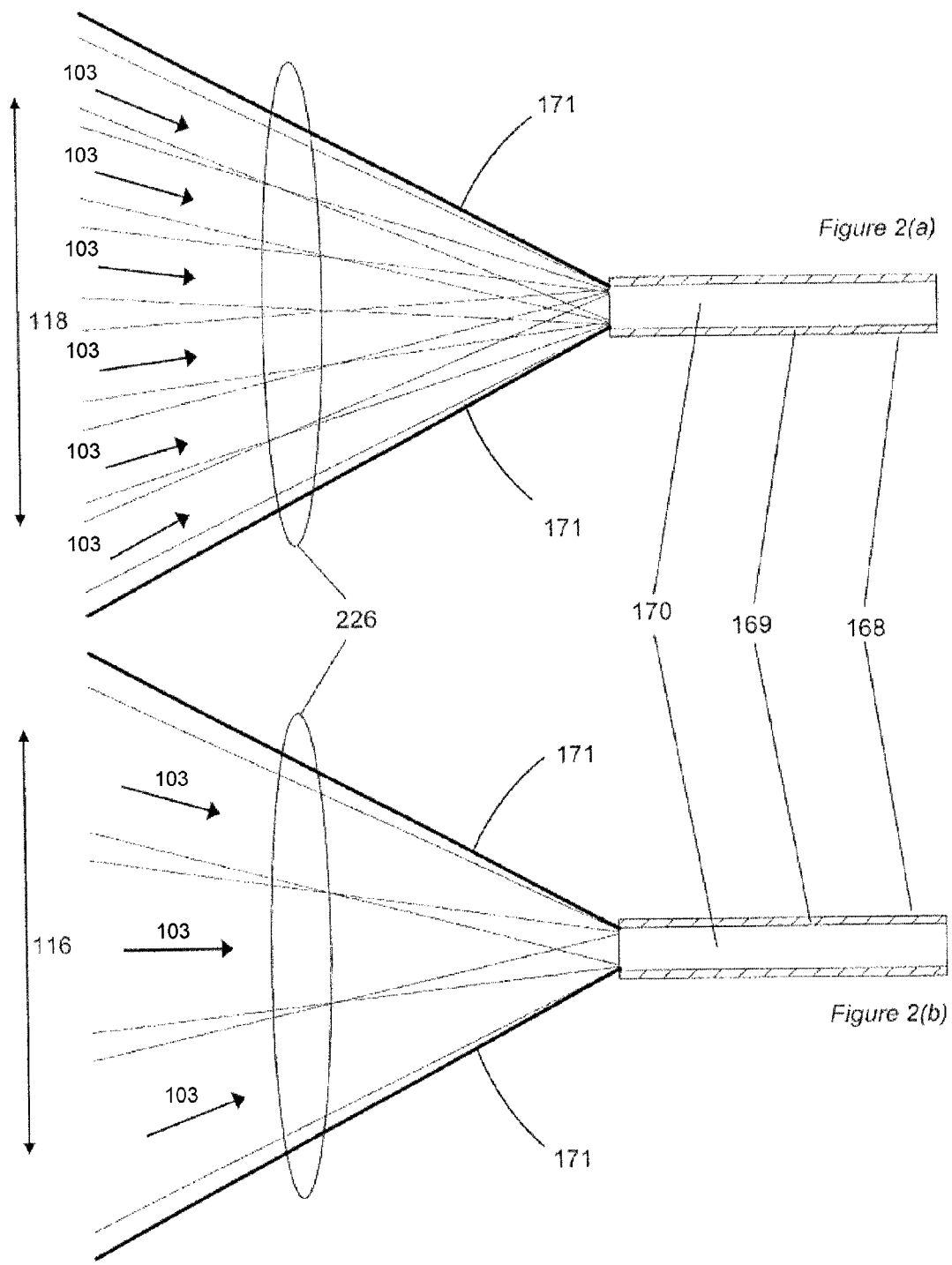

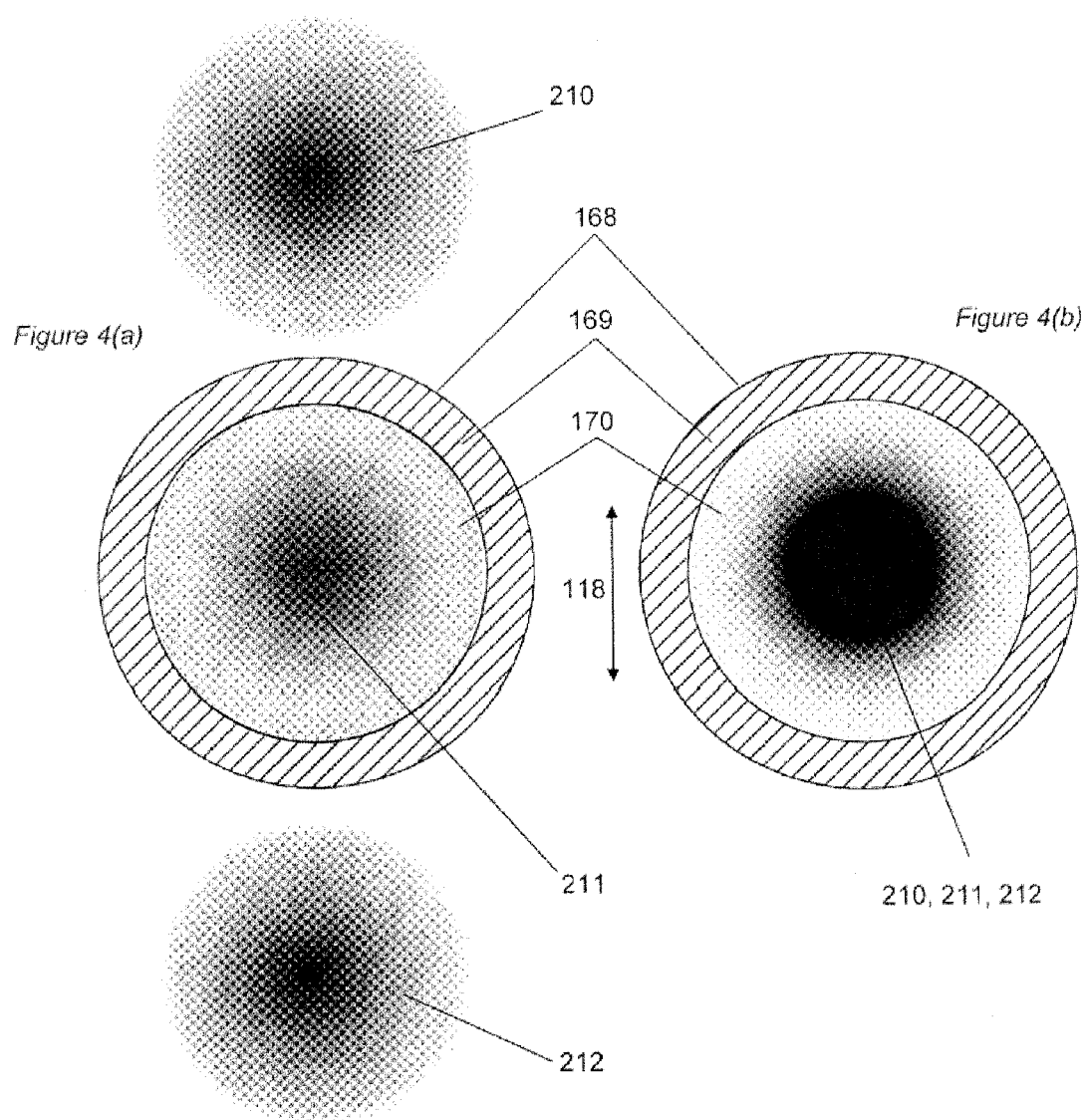

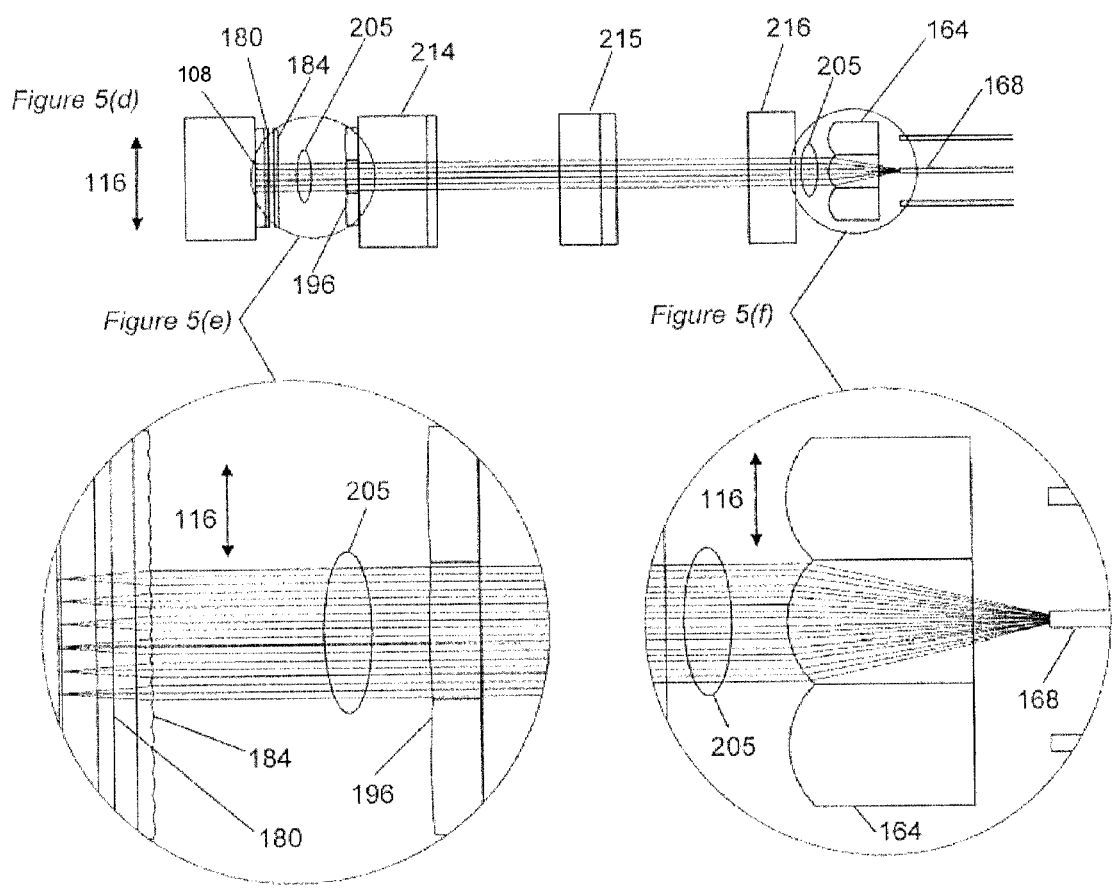

EFFICIENT GENERATION OF INTENSE LASER LIGHT FROM MULTIPLE LASER LIGHT SOURCES USING MISALIGNED COLLIMATING OPTICAL ELEMENTS

CROSS-REFERENCE TO RELATED APPLICATIONS

This patent application claims the benefit of U.S. Provisional Patent Application No. 61/693,973, filed Aug. 28, 2012, which is incorporated by reference.

TECHNICAL FIELD

The present inventive subject matter relates to lasers, and more particularly to optical configurations that effectively couple the outputs of two-dimensional laser diode arrays into optical fibers to provide high efficiency, high quality light sources having high intensity.

BACKGROUND

The compact size and high efficiency of semiconductor laser diodes make them the ideal candidates for applications requiring concentrated and spectrally pure laser light sources. Applications such as optical storage, low end printing and telecommunications that once used many different types of laser light sources, now almost exclusively use semiconductor diode lasers once these diode lasers with the required characteristics were successfully developed. The primary reason that semiconductor diode lasers have these very useful characteristics is that the excited or pumped laser area can be made very small through the use of semiconductor fabrication techniques such as photolithography and epitaxial layer growth. Due to the small lasing area, the gain and optical intensity, which are the two main ingredients necessary for efficient conversion of excited atoms in the lasing medium to lasing photons, the efficiency of a laser diode can be very high. This effect produces a laser source of high brightness: that is, a source of a certain power with relatively low beam divergence for its wavelength. Brightness can either be defined in terms of its Lagrange invariant, the area of the emitting light source times the solid angle of the divergence of the light from the source, or in the case of Gaussian beams, the $M^2$ parameter, known as the beam quality factor. An ideal beam is usually diffraction-limited and has an $M^2$ of 1, which is the lower limit for $M^2$. Such beams with low $M^2$ have a light intensity distribution that is substantially symmetric, viewed axially, with an ideal beam being perfectly symmetric.

Nevertheless, this primary advantage of semiconductor laser diodes—small lasing volumes—becomes a disadvantage when scaling these devices to higher powers. Single $TEM_{00}$ mode operation near the diffraction limit requires lasing modal dimensions (laser diode stripe width) to be typically less than 3-5 microns. As the power extracted from these lasing dimensions is increased, optical facet damage and other power related damage mechanisms usually limit the available power from these devices to be less than 500 mW. As the laser diode stripe width is increased to about 100 microns, powers in excess of ten (10) Watts can be achieved but at much reduced beam quality. Substantial asymmetries are seen in the fast axis brightness versus the slow axis brightness. The output from single broad area diode lasers is significantly inadequate for many applications in terms of both power level and beam quality. For example, applications in the of high-power processing of materials such as welding and the cutting and heat treating of materials such as metals, require power levels in the range of approximately 1 kW to approximately 5 kW with beam qualities equivalent to the output of a approximately 200-400 microns by approximately 0.14-0.22 numerical aperture (NA) multimode optical fiber.

The need to scale the output of semiconductor laser diodes to higher powers while maintaining beam quality has led to several approaches. The first is the well understood and documented approach to use these laser diodes to pump a solid state gain material such as NdYAG. In this approach, a low brightness output beam of an incoherent semiconductor laser diode array is converted via the gain material to a $TEM_{00}$ output beam having an $M^2$ nearly as low as 1.0. Another approach is to fiber-couple the output of many individual laser diodes or laser diode bars and cladding-pump a rare-earth-doped fiber laser. Near diffraction-limited $M^2$ values of <1.1 have been achieved with power levels greater than 800 W in an Yb doped double-clad fiber laser.

Applications such as material processing and solid state laser pumping require beams with $M^2$ values near the diffraction-limit, and much attention has been given to the use of beam shaping and steering techniques to improving the quality of the stacked laser diode array bars themselves. Most of these efforts have focused on beam shaping and steering techniques that treat the laser bar emitter as a single wide source (greater than 19% fill factor) of 5 to 10 mm in width. Devices using these techniques producing approximately 600 Watts in a 600 µm 0.22 NA multimode optical fiber are commercially available. Earlier techniques utilize individual 100 µm-wide laser emitters. These use either individual laser diode emitters aligned with the devices oriented perpendicular to the epitaxially grown diode junction along an arc, or individual laser diode emitters aligned in a single bar (less than 21% fill factor) that are individually collimated and passed through a 90° image rotating prism such that their fast axis directions become co-linear. While the image rotation technique has yielded high brightness beams, its application has been limited to single laser diode bars, and the power that can be concentrated in a single beam is far short the power levels that are required for many applications. High power broad area emitters are also required for some telecommunications applications and high power bars with less than 21% fill factors have recently become available with lifetimes that are long enough to meet the requirements of industrial applications.

SUMMARY

In an embodiment, the present invention provides a system for combining laser light sources. The system includes: a stack of laser diode bar arrays, comprising two or more laser diode bar arrays, each laser diode bar array having multiple laser diodes; a multimode optical fiber; and a plurality of optical elements disposed between the stack of laser diode bar arrays and the multimode optical fiber, configured to direct light from the stack of laser diode bar arrays to the multimode optical fibers, the plurality of optical elements further including: a plurality of fast-axis collimating (FAC) lenses, wherein at least one FAC lens of the plurality of FAC lenses corresponds to each laser diode bar array. At least one FAC lens of the plurality of FAC lenses is misaligned with respect to the corresponding laser diode bar array. At least one misaligned FAC lens has at least one of a translational position and a orientation relative to its corresponding laser diode bar array different from another FAC lens of the plurality of FAC lenses relative to its corresponding laser diode bar array.

In other embodiments, the present invention provides methods for positioning FAC lenses relative to corresponding laser diode bar arrays.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following:

FIGS. 2(a) and 2(b) are diagrams schematically illustrating cross-sectional views of the fast and slow axes, respectively, of beams emanating from a number of individual emitters as they converge on the entrance of an optical fiber;

FIG. 4(a) is a diagram schematically illustrating a cross-sectional end-on view of the fast axis beam focus at the input to the core of a multimode optical fiber without fast-axis collimating lens misalignment as illustrated in FIGS. 3(a), 3(b), and 3(c);

FIG. 4(b) is a diagram schematically illustrating a cross-sectional end-on view of the fast axis beam focus at the core of a multimode optical fiber with fast-axis collimating lens misalignment as illustrated in FIGS. 5(a), 5(b), and 5(c);

FIG. 5(d) is a diagram schematically illustrating a view of the slow axis where the output of a plurality of columns of laser diodes are combined into the cores of one or more multimode optical fibers;

FIG. 5(e) is a diagram schematically illustrating a detail view of the slow axis lensing arrangement at the output of columns of laser diodes illustrated in FIG. 5(d);

FIG. 5(f) is a diagram schematically illustrating a detail view of the slow axis lensing arrangement at the core of a multimode optical fiber illustrated in FIG. 5(d);

DETAILED DESCRIPTION

Figure 1A:
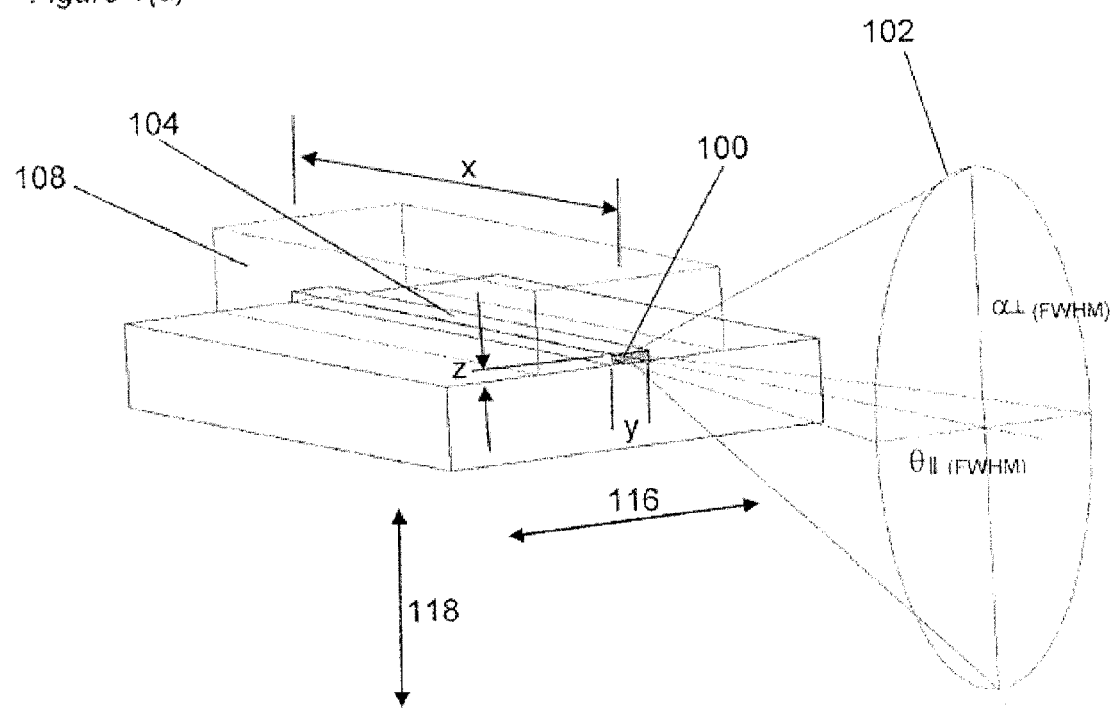
FIG. 1(a) is a diagram schematically illustrating a perspective view of an exemplary geometry of a single, broad area semiconductor laser diode having fast and slow axes.

Given that many applications either require or greatly benefit from a high-intensity beam with a low $M^2$, having substantially symmetric brightness, it is of significant benefit to produce such a beam as efficiently and cost effectively as possible. Minimizing the number of optical elements generally reduces cost and also reduces the number of surfaces that each beam of light has to traverse, thereby minimizing the losses incurred as a result of each such traversal. Minimizing such losses helps preserve laser beam power levels, aids in maximizing efficiency and also reduces element heating. Cost effectiveness may be increased by maximizing the number of laser light sources in a given optical assembly. Working to the functional size limits of optical elements generally enables the highest number of laser light sources to be processed by a given optical assembly. This improves utilization of the available optical elements, increases the available power per assembly and also decreases the effective cost per watt of output power. This cost effectiveness increases further in a system that may have multiple such laser assemblies.

The efficiency of coupling light into multimode optical fiber is constrained both by the core diameter and that the angle of incidence of any light beam that is coupled into the core must be less than the numerical aperture (NA) of the fiber being used. Laser light sources towards the far ends in the fast axis column direction of a stacked array comprising a large number of laser diode bars (e.g., on the order of 20 to 30 bars) may have output beams with high angles of incidence relative to the fiber's central axis. If the angle of incidence exceeds the fiber acceptance angle, or NA, that light will not be guided through the fiber, and will contribute nothing to the overall efficiency of the system. Therefore, it is of significant benefit that the optical elements comprising such an assembly be arranged so as to direct not only the central beams but also those at the far ends of a stacked array, having relatively high angles of incidence, into the fiber's angle of acceptance and within its core diameter. Utilizing an optical element or elements whose functional size approaches the upper limit for an optical element of that function generally enables capturing the beams from the laser light sources on the distal ends of such a large stacked array. Utilizing optical elements of such a size may be cost advantageous by comparison to utilizing a plurality of smaller elements or to duplicating all or a substantial portion of such an assembly in an attempt to reach comparable output power levels.

FIGS. 1(a)-1(c), FIGS. 2(a)-2(b), FIGS. 3(a)-3(c), and FIG. 4(a) provide an overview of, and explanatory context for, an exemplary environment in which embodiments of the present invention may be practiced. While this exemplary environment is directed to efficiently combining the output beams from two-dimensional arrays of laser diodes to form an intense high-quality fiber-coupled beam, it will be appreciated that embodiments of the invention are not limited to this specific exemplary environment.

FIG. 1(a) illustrates the typical geometry of a single broad area semiconductor laser diode 108 grown by epitaxial deposition. This device is characterized by an active region 104 of width y and thickness z and length x with an emitting aperture 100. This epitaxially grown and photolithographically defined region can be constructed in many different ways, but usually a single or multiple quantum well structure with an index-guided waveguide in a material structure such as InGaAsP is a preferred embodiment. The direction parallel to the semiconductor junction is referred to as the slow axis 116. In this direction, a stripe width y is defined photolithographically and the light emission from the aperture diverges in the far field 102 with the angle $\theta_\parallel$ defined at full width half maximum (FWHM). In contrast, the direction perpendicular to the semiconductor junction is referred to as the fast axis 118. In this direction a stripe thickness z is defined epitaxially and the light emission from the aperture diverges in the far field 102 with the angle $\alpha\perp$ also defined at FWHM. For typical devices, z is approximately 1 micron and y is usually in the range of approximately 50 microns to approximately 200 microns; $\theta_\parallel$ is approximately 10 degrees while $\alpha\perp$ is approximately 50 degrees. More importantly, the $M^2$ in the slow axis varies from approximately 10 to approximately 20 for stripe dimensions that approximate these and in the fast axis, the $M^2$ is near 1.

It will be appreciated that the etendue of a source is the product of emitting aperture and FWHM divergence angle. For circular beams, the etendue does not vary with the orientation of the plane in which it is measured. In a majority of laser diode output beams, however, the etendue of the beam in the direction parallel to the junction is different from the etendue of the beam in the orthogonal, perpendicular direction.

Figure 1B:
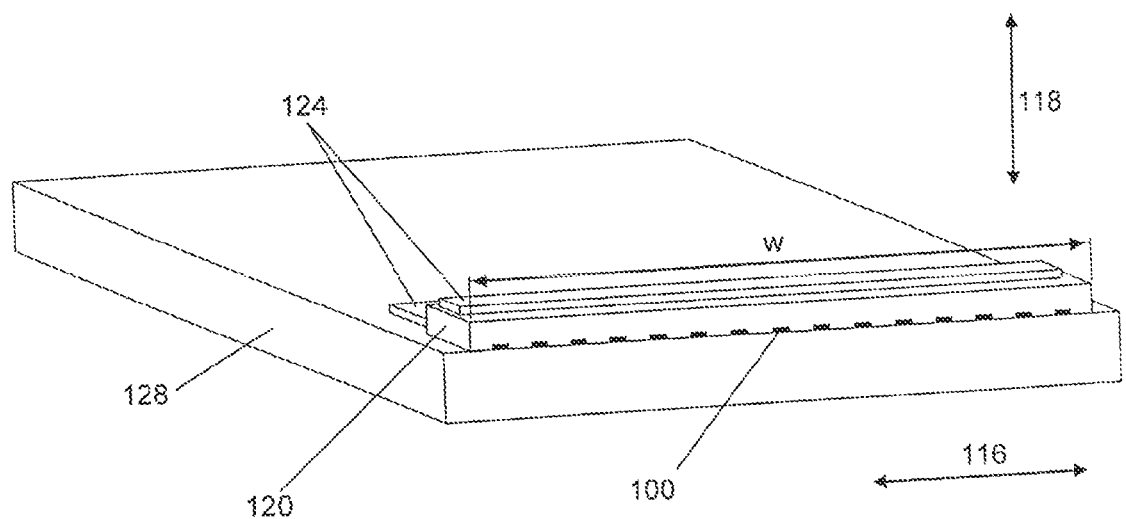
FIG. 1(b) is a diagram schematically illustrating a perspective view of a laser bar comprising multiple broad area semiconductor laser diodes in a one-dimensional array.

FIG. 1(b) illustrates how a plurality of broad area semiconductor laser diodes 108, each with an emitting region 100, can be defined photolithographically to create a laser diode array bar 120 or multi-stripe bar. This multi-stripe bar 120 has parallel electrical connections 124 to spread the high current load, and is mounted on a cooling substrate 128, made up of either a thermally conductive heat transfer plate, a water cooled plate, a heat pipe, a heat transfer plate incorporating a heat pipe, a heat transfer plate comprising a material with very high thermal conductivity such as graphene or pyrolytic graphite or yet other means of heat energy transfer. A microchannel cooling plate has excellent heat transfer properties and the cooling plate 128 is often of a micro-channel design. In the bar array 120, individual emitters are aligned in a direction that is approximately parallel to the slow axis direction 116 of each emitter and the fast axis direction 118 is approximately perpendicular to the slow axis direction 116. The far-field radiation pattern of the multi-stripe bar 120 is characterized as the linear sum of the far field radiation patterns 102 of the individual laser diode emitting regions 100 with each of the individual patterns 102 aligned axially with each of the laser diode emitting regions 100. In typical designs, the multistripe bar 120 may have 10 to 25 individual emitting elements 100, an overall width of 1 cm in the slow axis direction 116, and a total output power in the range of 40 to 100 watts.

Figure 1C:
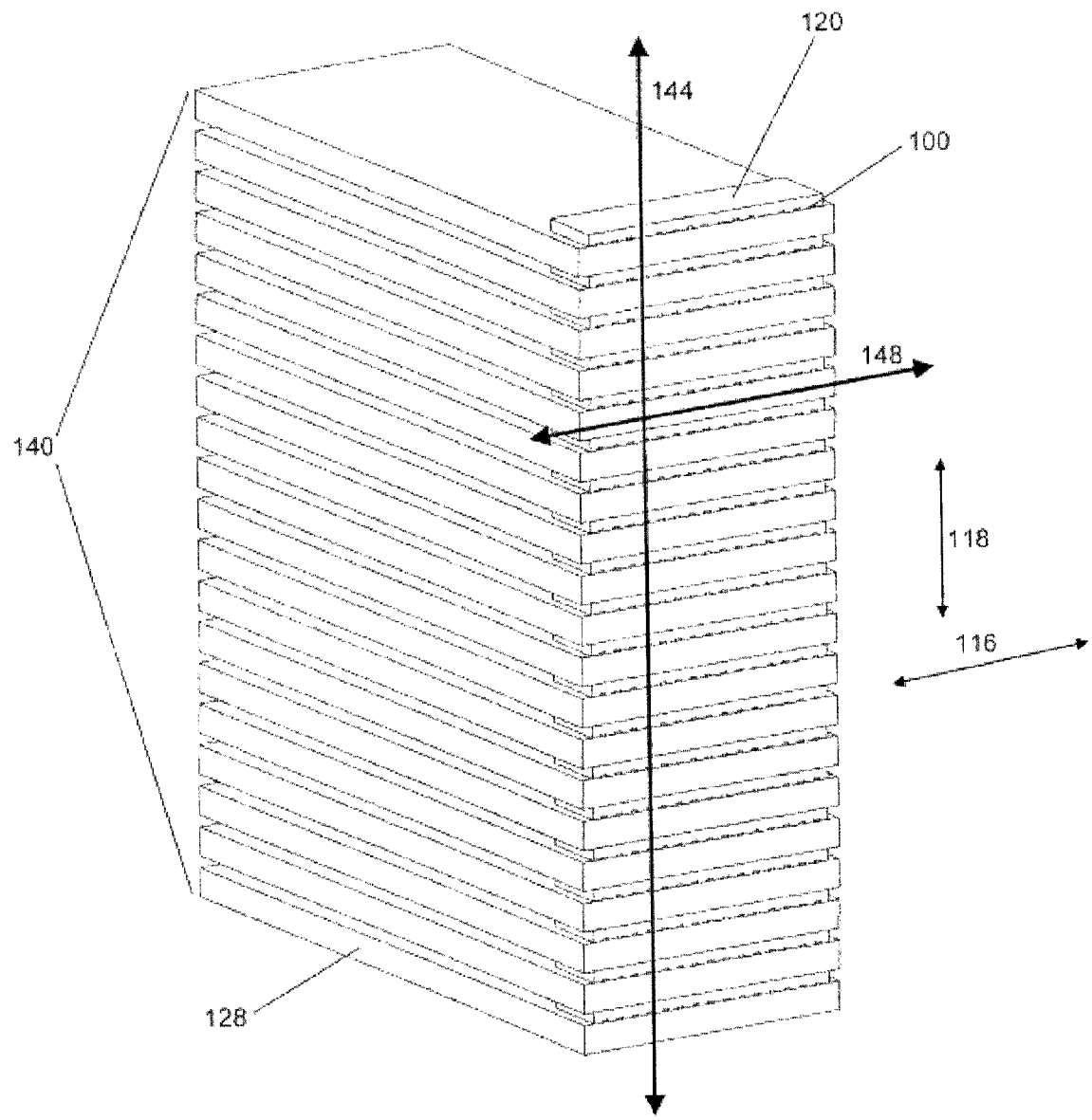
FIG. 1(c) is diagram schematically illustrating a perspective view of a two-dimensional laser array formed by stacking a plurality of laser bars of the type shown in FIG. 1(b)

FIG. 1(c) shows how a plurality of multi-stripe bars 120 can be arranged to create a two-dimensional ("2-D") stacked array 140. In a typical device, a plurality of multi-stripe bars 120 with their associated cooling substrates and electrical connections (the parallel electrical connections 124 not shown in this view for clarity) are stacked along the fast axis direction to form a two dimensional array. Such a 2-D stacked array 140 can be characterized as having a "row" or "row direction" 148 where the individual emitters 100 in each multi-stripe bar 120 all have their slow axis directions 116 aligned in the same horizontal plane. In a preferred embodiment, there is one multi-stripe bar 120 per effective row. Other embodiments are contemplated wherein there may be more than one multi-stripe bars 120 per effective row. Such a 2-D stacked array 140 can also be characterized as having a "column" or "column direction" 144 where columns of individual emitters 100 in multiple multi-stripe bars 120 all have their fast axis directions 118 aligned in the same vertical plane. The bars 120 are mounted such the laser diodes 108 in each column of the 2-D array 140 are aligned with each other, preferably within a tolerance of 5 microns or less, in order to prevent significant degradation of the quality of the beam generated by combining the outputs of the laser diodes, as described in greater detail below. In an exemplary 2D array, there are 25 multi-stripe bars 120 with each bar having 18 emitters. Alternative 2-D array designs may have approximately 10 to approximately 25 multi-stripe bars 120 with each bar having approximately 10 to approximately 30 laser diodes 108 and typically may generate total output power in the range of approximately 500 Watts to approximately 3000 Watts, though higher powers are practicable as well. Further, such a 2-D stacked array 140 with columns and rows of laser diodes, with the fast axes of the laser diodes lined up along the column directions 144 and the slow axes of the laser diodes along the row directions 148, may be used as a building block to construct a system having high-brightness, high-quality laser beam or beams.

The combination of substantially symmetric brightness and high intensity in a fiber-coupled laser beam is achieved by combining, into a multimode optical fiber, the light outputs from a plurality of emitters in one or more columns of a 2-D array, a column being formed by a plurality of laser diodes with their fast axes aligned in the column direction. Generally, when coupling the output beam of a single laser diode into a multimode optical fiber, the maximum etendue for the single laser emitting region 100 is in the non-diffraction-limited slow axis direction 116. This etendue in the slow axis direction 116 is defined as the product of the laser stripe width y times the far field angular divergence $\theta_\parallel$ and the etendue in the fast axis direction is defined as the stripe thickness, z, in the fast axis direction times the far field angular divergence $\alpha\perp$.

When light from multiple laser diodes is combined by focusing the output beams into the core of a multimode optical fiber, it is advantageous for the etendues of the combined beams in the fast and slow axis directions to be approximately matched to the etendue of the multimode fiber core. Since the fiber core is approximately symmetric, it is also advantageous for the etendues in the fast and slow axes to be approximately equal to one another. In this application, the term symmetric brightness unit (SBU) is used to refer to a group of diode laser emitters, that are typically elements of a bar or 2D array, and the associated optical elements that are used to combine the beams such that the fast and slow axis etendues are approximately equal and approximately equal to the etendue of the multimode fiber. The limiting value for the etendue of the SBU output is determined by the number of 2D array columns that contribute energy to the SBU output and by the etendue of the individual emitters in the direction parallel to their junctions. The highest power coupling efficiencies are typically obtained when the etendue of the SBU output is approximately equal to the etendue of the multimode fiber. In one example, the number of laser diodes 108, n, which can be coupled to form an SBU with maximum output intensity is equal to the ratio of the fast direction etendue and slow direction etendue of an individual emitter, as expressed by the following equation:

$$n=(z \cdot \alpha \perp)/(y \cdot \theta_{\parallel})$$

Once n is calculated, the multimode optical fiber 168 of a desired diameter and NA is then chosen to match the etendue of the SBU output beam (which, in this example, is approximately equal to the slow axis etendue of a single diode emitter). Slightly increasing either the diameter or NA of 168 will lower the overall brightness of the SBU but increase the efficiency of the fiber coupling. It will be appreciated that, while this formula is applicable to laser diodes as light sources, it can also be applied to other light sources as well. It will be further appreciated that the coupling efficiency in real-world systems is affected by additional parameters and SBU's with slightly asymmetric output beams and etendues that are somewhat greater than the minimum value may be coupled to multimode fibers with near-maximum efficiencies. Optical aberrations such as spherical aberration and coma, or variation in the mounting flatness of the laser diode bar 120 (referred to as "laser bar smile"), as well as manufacturing defects specific to individual emitters, can all decrease the overall brightness of an SBU and require a larger multimode optical fiber 168 diameter or NA for comparable coupling efficiency. These aberrations and defects may also adversely affect the symmetry of an SBU.

It will be appreciated that while the exemplary environment includes coupling into a multimode optical fiber 168, other embodiments of the present invention in other environments may be coupled into different optical systems, such as a materials processing optical system.

FIGS. 2(*a*) and 2(*b*) show schematically in the fast and slow axes respectively how the beams from multiple laser diodes should ideally converge at the core of the multimode optical fiber 168 in order to couple efficiently. It will be appreciated that the depicted number of beams is merely illustrative, and may not correspond to the actual number of laser beams in a given environment. The multimode optical fiber 168, shown in cross-section, comprises a cladding layer 169 and a core 170 and is characterized by its core diameter and acceptance angle 171.

In the fast axis direction 118, an output bundle of a plurality of beams 226 is directed in the direction 103 along with the beams from the other individual laser diodes 108 in a given column so as to converge toward the core 170 of the multimode optical fiber 168. As each beam from each laser diode 108 is focused to a size optimal for coupling into the core 170 of the desired optical fiber 168, beams from a plurality of laser diodes 108 are each directed at a different angle such that the bundle of beams is contained within the acceptance angle 171 of the multimode optical fiber 168.

In the slow axis direction 116, the beams from the plurality of laser diodes 108 in a given column with their direction of propagation 103 are directed in the direction 103 along with the beams from a plurality of other columns 144 so as to converge toward the multimode optical fiber 168 entrance face such that each beam is focused to the desired core 170 diameter and numerical aperture for a chosen multimode optical fiber 168.

In an implementation of the exemplary environment, the number of columns selected to be summed into a given fiber is selected based on the number of individual laser diodes 108 in said column 144 so as to provide substantially equivalent brightness in both the fast and slow axes. In this way, an SBU is created by transforming a plurality of laser diodes 108 of asymmetric brightness into a source of symmetric brightness which, in an exemplary embodiment, is fiber-coupled. In one particular exemplary application, the optimum ratio of columns to rows is approximately 6 columns to approximately 25 rows, based upon presently available laser diode technology, in order to achieve a substantially symmetric brightness. Different column-to-row ratios may be chosen via the selection of suitable slow-axis optical elements 196, 164 based on the formation of an SBU as described above. Other implementations, which may use other 2-D diode laser arrays fabricated with laser diodes having different fast-to-slow axis brightness ratios or other laser light sources having different fast-to-slow axis brightness ratios, may have a column-to-row ratio different than the ratio indicated here and according to an aspect of the inventive subject material, have slow axis optical elements 196, 164 selected accordingly.

An SBU formed by combining the laser emissions from one or more columns of laser diodes 108 into the core 170 of a multimode optical fiber can be combined with other fiber-coupled SBUs from the same 2-D array so as to provide a high-intensity beam. Furthermore, as already mentioned above, the 2-D laser array may be used as a building block in a system for generating a substantially symmetric high-brightness output laser beam. The number of 2-D laser arrays used in the system depends on the desired output level, and the light generated by laser diodes in the 2-D laser arrays may be combined through one or more combination stages to achieve a substantially symmetric, high-brightness output beam.

FIGS. 3(*a*)-3(*c*) illustrate an implementation of the exemplary environment including the 2-D laser array and the multimode optical fiber 168, along with an optical assembly 228 between the laser array and optical fiber, the optical assembly 228 including a plurality of the fast-axis collimating (FAC) optical elements 180, each FAC optical element being aligned to and attached to the emitters of a corresponding row of laser diodes (i.e., "alignment" in this context is explained in further detail below with respect to FIG. 5(*a*) and FIGS. 6(*a*)-(*b*)).

FIG. 3(*a*) illustrates the fast axis view of a configuration where laser diodes 108 are aligned in a column 144 with the direction of their far field outputs parallel to each other. The figure depicts a cross-sectional view of a column 144 of a 2-D laser array 140, such as the one shown in FIG. 1(*c*), and a few corresponding beams 210, 211, 212 emanating from emitting apertures of the diodes 108 in the single column in the cross-sectional view. As described above, the laser diodes 108 in the column 144 are arranged such that their fast axes align with the column direction.

In order to image the light outputs from the column of laser diodes 108 into the core 170 of a multimode optical fiber 168, the multi-axis optical assembly 228 comprising multiple optical elements is disposed between the laser diodes 108 and the core of the multimode optical fiber 168. In FIG. 3(*a*), the multi-axis optical assembly 228 comprises fast axis collimating (FAC) lenses 180 and slow axis collimating microlens array (SAC) 184 along with a plurality of other optical elements whose function will be discussed in detail further below. The FAC lenses 180 and SAC lenses 184 collimate the output of the laser diodes 108 in the fast 118 and slow 116 axis directions respectively, resulting in collimated beams 210, 211, 212 (only these three exemplary collimated beams are depicted for clarity). Collimating optical elements such as the FAC lenses 180 are typically cylindrical optical elements. Other types of optical elements may also be used as the FAC optical elements, for example, gradient index (GRIN) lenses or optical elements comprising materials having a negative index of refraction, including GRIN lenses comprising materials having a negative index of refraction. In a preferred embodiment, there is one FAC lens 180 for each row of the 2D laser array and one SAC lens 184 per emitter. The SAC lenses 184 may be arranged as an array of micro lenses, each of which provide slow axis collimation to the output of an individual laser diode 108.

Figure 3A:
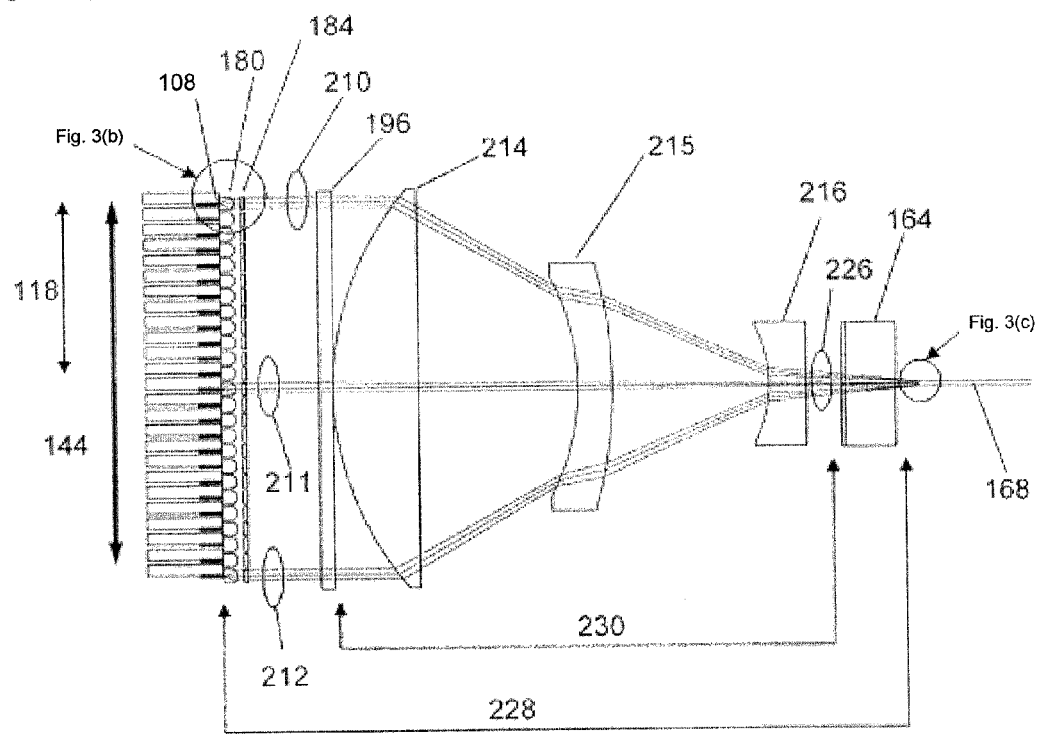
FIG. 3(a) is a diagram schematically illustrating a view of the fast axis, for an exemplary beam combining configuration where the fast-axis collimating lenses corresponding to the individual laser diodes are arranged without misalignment relative to corresponding laser diode bars.
Figure 3B:
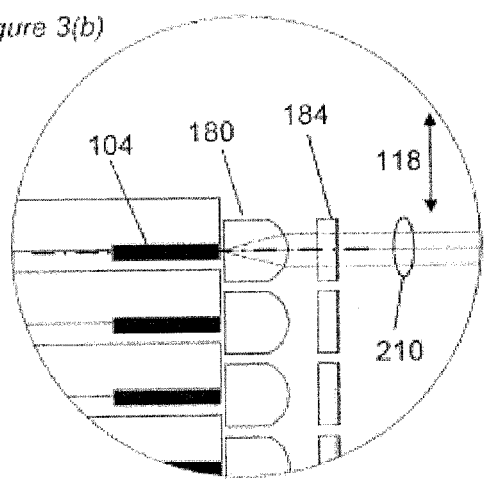
FIG. 3(b) is a diagram schematically illustrating a detail view of an exemplary fast-axis collimating lens arrangement without misalignment at the output of the laser diodes in the system illustrated in FIG. 3(a)

FIG. 3(b) illustrates a detail of the fast axis near the laser diodes 108 and illustrates the collimation of beam 210. FIG. 3(b) is also illustrative, with respect to the alignment of the FAC 180 with the laser diode 108, of the rest of the FAC lenses 180 and their corresponding laser diodes 108, including the middle of the stacked array 140 where beam 211 is collimated and also the opposite side of the stacked array 140 where beam 212 is collimated. In this exemplary configuration, as the position of a laser diode 108 is increasingly near to either distal end of a stacked array 140, the angle of incidence relative to the longitudinal axis of the multimode optical fiber 168 increases beyond the acceptance angle 171 of the multimode optical fiber 168. With the FAC lens 180 being aligned to the laser diodes 108 of the corresponding laser diode bar, this increase in the angle of incidence results in the beams generated from such positions delivering their energy increasingly outside the acceptance angle 171 of the multimode optical fiber 168, outside the diameter of the core 170 of the multimode optical fiber or outside of both the core 170 and the acceptance angle 171 of the multimode optical fiber as illustrated by FIG. 3(c) in a detail around the core 170 to the multimode optical fiber 168.

Figure 3C:
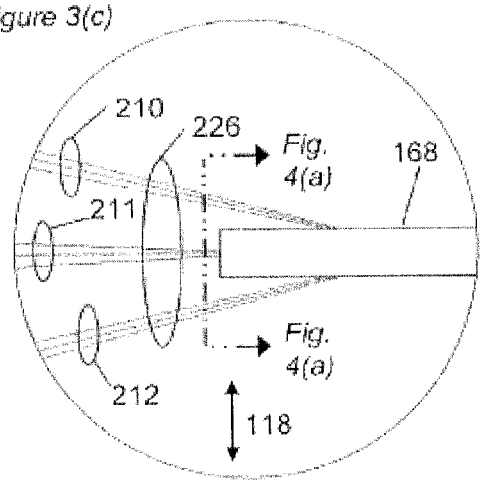
FIG. 3(c) is a diagram schematically illustrating a detail view of the exemplary fast axis beam focus at the core of a multimode optical fiber without misalignment of the fast-axis collimating lens arrangement illustrated in FIG. 3(a)

As illustrated by FIG. 3(c), with the FAC lenses 180 aligned to the corresponding laser diode bars, the beams 210, 212 from the laser diodes 108 from laser diode bars at the distal ends of the stacked array 140, deliver their energy external to the core 170 of the multimode optical fiber 168. FIG. 4(a) illustrates this from an end-on view of the multimode optical fiber 168, where the beams 210 and 212 can be seen to be missing the core 170 to the multimode optical fiber 168 entirely. Any such energy that is not delivered within both the acceptance angle 171 and core 170 of the multimode optical fiber 168 is energy that is not delivered to the output and is wasted. While only beams 210, 212 from the distal ends of the stacked array 140 are illustrated as missing the core 170 of the multimode optical fiber 168, those laser diodes 108 whose positions are increasingly near to the distal ends of the stacked array 140, also deliver all or some portion of their energy external to the core 170 of the multimode optical fiber 168. This wasted energy results in efficiency that is typically in the range of approximately 50% to approximately 60%.

It will be appreciated that in other configurations, the beams may converge at the optical fiber in a different manner than the manner depicted in FIG. 3(c). For example, the beams from the emitters at the distal edges may approach the optical fiber too sharply, and those beams may cross paths before reaching the optical fiber and miss the optical fiber on the opposite side. Additionally, inaccuracies may be introduced by manufacturing defects in each individual emitter (or defects in the shape of the bar), and beams originating from different bars and different emitters may miss the optical fiber in an arbitrary, non-systematic manner.

According to an embodiment of the invention, misalignment of one or more of the FAC lenses 180 relative to their corresponding laser diode bars, as illustrated by an exemplary embodiment shown in FIGS. 5(a)-(f), directs a greater number of the beams and greater portion of said beams from the laser diodes 108 into the core 170 and within the acceptance angle 171 of the multimode optical fiber 168 than with the FAC lenses 180 being aligned, resulting in much less energy being wasted. In certain embodiments, this results in the efficiency typically being increased from the range of approximately 50% to approximately 60% without FAC lens 180 misalignment to the range of approximately 85% to approximately 90% or more, with FAC lens 180 misalignment.

Figure 5A:
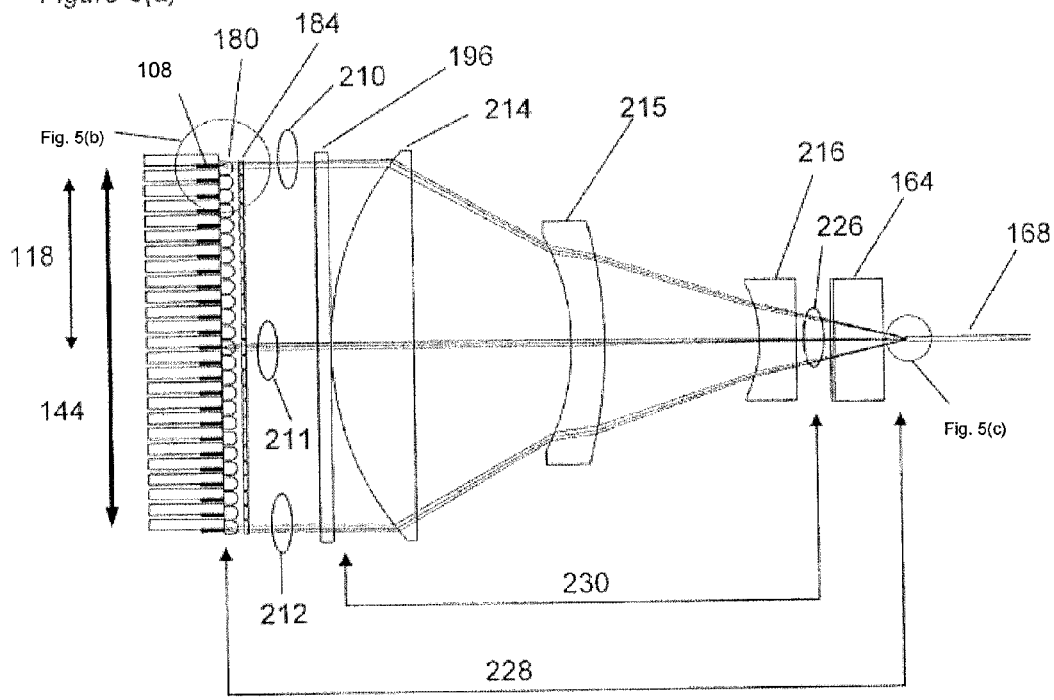
FIG. 5(a) is a diagram schematically illustrating a view along the fast axis of an exemplary beam combining configuration where the fast-axis collimating lenses corresponding to the individual laser diodes are arranged with misalignment relative to corresponding laser diode bars in an exemplary embodiment of the present invention.
Figure 5B:
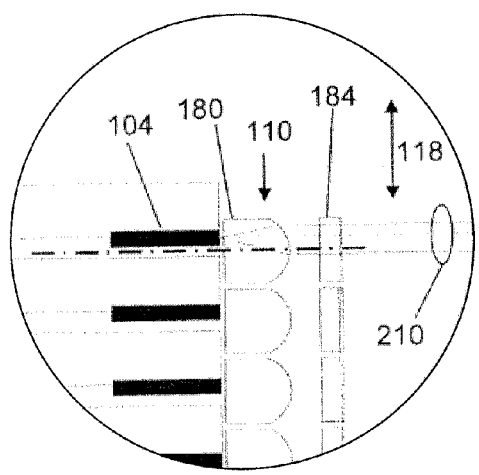
FIG. 5(b) is a diagram schematically illustrating a detail view of the exemplary fast-axis collimating lens arrangement with misalignment at the output of the laser diode illustrated in FIG. 5(a)

FIG. 5(a) illustrates a fast axis view of an exemplary embodiment comprising a stacked array 140, a multi-axis optical assembly 228 and a plurality of multimode optical fiber 168, though only one multimode optical fiber is visible in this view. The multi-axis optical assembly 228 comprises multiple optical elements which are disposed between the laser diodes 108 and the core 170 of the multimode optical fiber 168. The exemplary embodiment illustrated in FIG. 5 is similar to FIG. 3, except that the FAC lenses 180 are "misaligned" relative to the respective laser diode bars as depicted in detail in FIG. 5(b) and described below, so as to direct relatively more beams to the core 170 of the multimode optical fiber 168. With reference to FIGS. 6(a) and 6(b), which are explained below with more detail, this "misalignment" means that an FAC lens (element 235 in FIG. 6(b)) is, relative to an aligned configuration, translationally offset in any of the X-axis (element 225 in FIG. 6(a)), Y-axis (element 229 in FIG. 6(a)), and Z-axis (element 227 in FIG. 6(a)) directions and any combination thereof, and/or is angularly offset (i.e., rotated) in any of the pitch (element 233 in FIG. 6(a)), yaw (element 235 in FIG. 6(a)), and roll (element 231 in FIG. 6(a)) orientations and any combination thereof. The aligned position is depicted in FIG. 6(b), with the longitudinal axis 241 (which is in the center of the FAC lens with respect to the fast-axis direction) and the optical axis 239 (optical axis 239 may also be thought of as a plane across a cross-section of the FAC lens) of the FAC lens being aligned to an orthogonal projection from the emitter center 237 of laser diode emitter 100 without translational offset or rotation, as discussed below in further detail.

The positions of the SAC lenses 184 may also be misaligned with respect to corresponding laser diode 108 with respect to the central optical axis of the SAC lenses 184 in the slow-axis direction. In a preferred embodiment the FAC lenses 180 and SAC lenses 184 are fastened together in a subassembly (e.g., the FAC lenses 180 may be misaligned so as to improve beam steering with respect to the fast-axis direction, and then the SAC lenses 184 may be attached to the FAC lenses 180 and another misalignment of the FAC-SAC assembly takes place so as to improve beam steering with respect to the slow-axis direction).

Figure 5C:
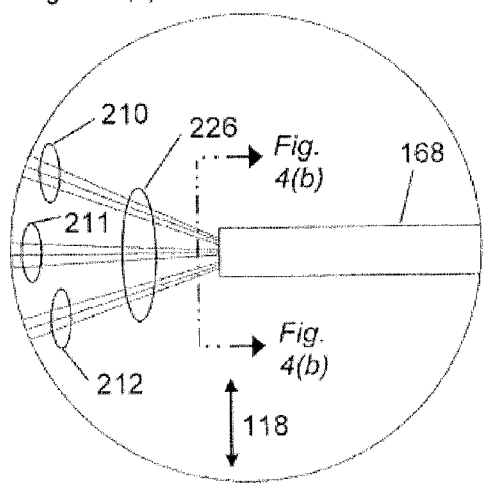
FIG. 5(c) is a diagram schematically illustrating a detail view of the fast axis beam focus at the core of a multimode optical fiber, where the system has misalignment of the fast-axis collimating lens as illustrated in FIGS. 5(a) and 5(b)
Figure 6A:
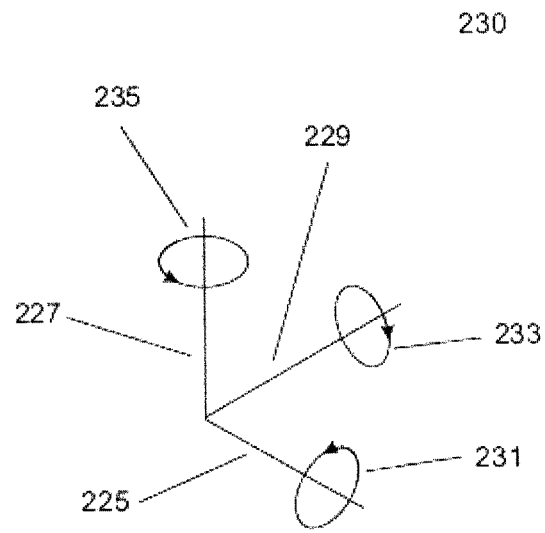
FIG. 6(a) is a diagram showing a reference coordinate system.
Figure 6B:
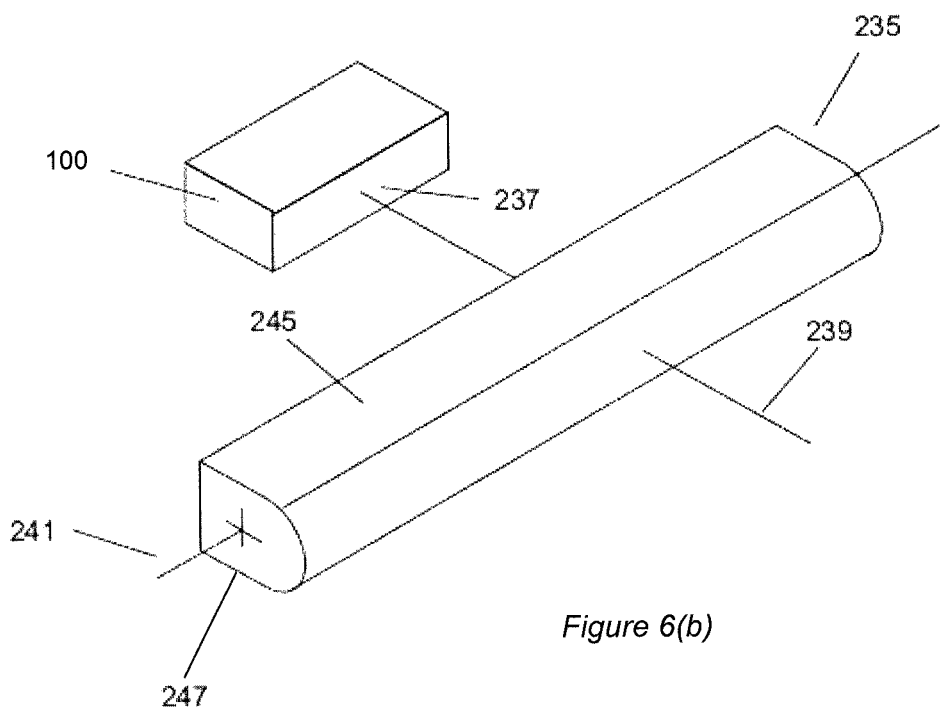
FIG. 6(b) is a diagram schematically illustrating a laser diode emitter with a cylindrical fast-axis collimating lens.

In the exemplary embodiment that is illustrated in FIGS. 5(a)-5(c) the FAC lens 180 is misaligned by translation along a line that is parallel to the fast axis direction 118. In alternative embodiments, the FAC lens 108 may be misaligned in other translational ways, in rotational directions, or by a combination of translation in any direction and/or rotation in any angular direction. To aid in understanding this principle, FIGS. 6(a) and 6(b) are provided to illustrate the various translational and angular directions in which an FAC lens 180 may be misaligned and to clarify what is meant by "misalignment." FIG. 6(a) illustrates set of orthogonal coordinate axes 225, 227 and 229 and the three corresponding orthogonal rotation directions 231, 233 and 235. Conventionally, the axis 225 is the X axis, the axis 229 the Y axis and the axis 227 is the Z axis. Rotation about the X axis 225 in the direction of the arrow is known as 'roll' 231, rotation about the Y axis 229 is 'pitch' 233, and rotation about the z axis 227 is 'yaw' 235.

FIG. 6(b) illustrates a single diode laser emitter 100 and a cylindrical FAC lens 235. The alignment parameters of the FAC lens 235 and the diode laser emitter 100 may be visualized by superimposing the coordinate system 230 on the diode laser so that that the origin is coincident with the emitter center 237 and the X axis 225 is coincident with an orthogonal projection from the emitter center 237 (also coincident with the optical axis 239 of the FAC lens 235). In this visualization, the Z axis 227 corresponds to the fast-axis direction, and the longitudinal axis 241 of the cylinder lens 235, which is midway between the upper cylinder lens surface 245 and the lower cylinder lens surface 247, intersects the orthogonal projection from the emitter center 237 and is in the same plane as the X and Y axes (the z=0 plane). The aligned condition is thus an initial condition where a fast direction optical axis 239 of the cylinder lens coincides with the X axis 225, and the longitudinal cylinder axis 241 is parallel to the Y axis 229 and in the same plane as the X and Y axes (under these conditions there is no translational offset in the Z-axis direction with respect to the cylinder axis 241 relative to the orthogonal projection from the emitter center 237). When the cylinder lens 235 is translated or rotated relative to the initial aligned condition, it is said to be "misaligned" with respect to the diode laser emitter. This definition of alignment may be applied to single diode emitters, bar arrays and 2D diode arrays, and may be adapted to describe the alignment of the SAC lenses 184.

In the exemplary embodiment illustrated in FIG. 5(a), the laser diodes 108 in the stacked array 140 generate beams which are collimated, directed and focused by the multi-axis optical assembly 228. The FAC lenses 180 and SAC lenses 184 collimate the output of the column 144 of laser diodes 108 in the fast 118 and slow 116 axis directions respectively, resulting in collimated beams, of which only three collimated beams 210, 211, 212 are shown for clarity. Such collimating optical elements as the FAC lens 180 are typically, though not limited to, cylindrical optical elements but could also be gradient index (GRIN) lenses or optical elements comprising materials having a negative index of refraction, including GRIN lenses comprising materials having a negative index of refraction. The SAC lens 184 comprises an array of micro lenses each of which provide slow axis collimation to the output of an individual laser diode 108.

FIG. 5(b) illustrates a detail view of the fast axis near the laser diodes 108 and illustrates the collimation of beam 210. The FAC lens 180 that collimates beam 210 has its central axis misaligned from the central emitting axis of the corresponding laser diode 108 and displaced in the direction 110, defined as towards the center of the stacked array 140 along the fast axis. In this specific exemplary embodiment, with respect to the alignment of the FAC lens 180 with the laser diode 108, the FAC lenses 180 are arranged such that as a laser diode 108 in a stacked array occupies a position increasingly near to either distal end of the stacked array, the corresponding FAC lens is increasingly displaced in direction 110, with the FAC lenses 180 at the distal ends having the most displacement in direction 110. On the opposite side of the stacked array 140 where beam 212 is collimated, the corresponding FAC lens 180 would be displaced in direction 110, towards the center of the stacked array along the fast axis, approximately the same amount as the FAC lens 180 that is collimating beam 210. The FAC lens 180 collimating beam 211 in the center of a the stacked array 140 would be aligned with the corresponding laser diode bar as previously illustrated in FIG. 3(b), as would a plurality of FAC lenses 180 proximal to the central FAC lens 180.

It will be appreciated that the translational misalignment of the FAC lenses 180 relative to the laser diode bars is specific to this embodiment, and that the FAC lenses 180 may be misaligned in a different manner in other embodiments. Further, the FAC lenses 180 may be individually translationally and/or rotationally misaligned (in 6-axis coordinate space) to account for irregularities in the diode array or focusing elements, with each FAC lens 180 being aligned in a different manner to optimize beam steering relative to the corresponding laser diode bar. For example, manufacturing defects in individual emitters of different laser diode bars may cause different translational and/or rotational misalignments to be optimal for the FAC lenses 180 corresponding to those different laser diode bars.

The misalignment of the FAC lens 180 with the corresponding laser diode bar array in direction 110, as illustrated in FIG. 5(b) compensates for the increase in the angle of incidence of the beams generated from laser diodes 108 in the distal positions the stacked array 140 and laser diodes 108 in those positions proximal to them (according to the specific configuration shown in FIGS. 3(a)-3(c) and FIG. 5(a)). As illustrated by beams 210 and 212 in FIG. 5(c) in a detail around the core 170 to the multimode optical fiber 168, more beams are able to enter the multimode optical fiber 168 and such beams are now able to deliver a higher percentage of their energy inside the acceptance angle 171 of the multimode optical fiber 168, and inside the diameter of the core 170 of the multimode optical fiber than with the FAC aligned as illustrated in FIG. 3(b). In certain embodiments, misalignment of one or more FAC lenses results in the diode-to-fiber coupling efficiency typically being increased from the range of approximately 50% to approximately 60% without FAC lens 180 misalignment to the range of approximately 85% to approximately 90% or more, with FAC lens 180 misalignment. FIG. 4(b) illustrates the increase in both the number of beams and the percentage of each beam entering the core 170 of the multimode optical fiber 168 from an end-on view of the multimode optical fiber 168, where the beams 210, 211 and 212 are illustrated to be focused on and entering the multimode optical fiber 168. While only these three beams 210, 211 and 212 are illustrated for clarity, the principles of the inventive subject matter is applied to all the beams generated from the laser diodes 108 in the stacked array 140 according to their position relative to the center of the stacked array 140.

For different embodiments and configurations, the degree to which each FAC lens 180 should be misaligned is different. In one embodiment, the misalignment is determined by measurement of the power through the multimode optical fiber 168 from the multi-stripe bar 120 or row of multi-stripe bars 120 being collimated by said FAC lens 180. Using this method, the FAC lens 180 starts in alignment with the laser diodes 108 of a laser diode bar, and the power through the multimode optical fiber is measured; the FAC lens 180 is then repositioned (e.g., in direction 110 as illustrated in FIG. 5(b)) until a maximum measured power is determined. Then, the FAC lens 180 is fixed in place and the next FAC lens 180 is measured, adjusted and fixed in place until all of the FAC lens 180 are misaligned to the extent needed to maximize power through the multimode optical fiber 168. In the specific embodiment shown in FIGS. 5(a)-(c), it will be appreciated that for those laser diodes 108 near the center, no misalignment may be needed.

In another embodiment, the degree to which each FAC lens 180 should be misaligned can be determined prior to fiber coupling by imaging the focused light into a camera rather than into the multimode optical fiber 168, and then optimizing the positioning of each individual FAC lens 180. Using this method, the axis of the FAC lens 180 starts in alignment with the laser diodes 108 of a laser diode bar, and the image captured by the camera is observed; the FAC lens 180 is then repositioned (e.g., in direction 110 as illustrated in FIG. 5(b))

until an optimal image is achieved. Then, the FAC lens 180 is fixed in place and the next FAC lens 180 is measured, adjusted and fixed in place until all of the FAC lens 180 are misaligned to the extent needed to optimize the image captured by the camera, recognizing that for those laser diodes 108 near the center, no misalignment may be needed. After adjustment, the camera is removed and the multimode optical fiber 168 installed.

In yet another embodiment, the degree to which each individual FAC lens 180 should be misaligned combines both of the methods described above. In such an arrangement, it is contemplated that at least one of the occasions of a FAC lens 180 being fixed in place will be in such a time and manner that the fixing must be able to be undone or redone in order for the FAC lens 180 to be repositioned if necessary. It is also contemplated that whether used singly or in combination, the above methods can be automated using a computational device such as a PC or a purpose-built test station having sufficient computational capability to process the input from the power meter, the camera or from both and to control robotic or other manipulator or manipulators, whether electro-mechanical, pneumatic or hydro-mechanical, which are capable of positioning, re-positioning and fixing in place, temporarily or permanently, the FAC lenses 180 or other optical elements such as may be needed.

In an exemplary embodiment, the alignment of the FAC lenses 180 is performed using a mechanical platform (e.g., a hexapod positioner) allowing for both translational and angular adjustments. Once suitable positions are found, the FAC lenses 180 are attached to the laser diode stack. Each FAC lens may be aligned on its own, or groups of FAC lenses may be aligned together.

As discussed above, intentionally misaligning the collimating lenses can be used to correct a variety of defects in the optical system. While the stacked array 140 is ideally a regular 2-D array of laser diodes 108 on a precise and uniform 2-D grid, in practice this is not the case due to registration errors in the spacing between the multi-stripe bars 120, the registration of the multi-stripe bars 120 in the slow axis 115 and propagation directions. Registration errors of the multi-stripe bars 120 in the stacked array 140 can also occur in the 3 angular directions associated with the 3 axes 102, 116, 118 defined by the stacked array 140. Misalignment of the FAC lenses 180 from the center point relative to each multi-stripe bars 120 can translate the collimated and subsequently focused beams 210, 211, 212 from the laser diodes 108 in each multi-stripe bars 120 to a place that can help compensate for these other errors and optimize the fiber coupling efficiency. Such error-compensating misalignment may entail moving each FAC lens 180 in arbitrary angular and translational directions.

Turning now to the description of the remaining fast axis optical elements, in the exemplary embodiment illustrated in FIG. 5(a), the fast axis focusing and directing of the individual collimated beams is accomplished through the use of a cylindrical fast-axis optical assembly 230 through which the individual collimated beams pass, with only beams 210, 211 and 212 shown for clarity. The cylindrical fast-axis optical assembly 230 comprises three cylindrical lenses 214, 215 and 216, in an inverse telephoto type arrangement. Cylindrical lens 214 has a positive effective focal length and functions as a fast axis beam-steering lens. Cylindrical lens 214 is followed by cylindrical lens 215, a negative meniscus lens which serves to focus the fast axis beams. Cylindrical lens 215 is followed by cylindrical lens 216, which has a negative effective focal length and aids in directing the fast axis beams 210 into the fiber 168 within the fiber's acceptance angle 171. Optical elements such as positive focal length cylindrical lens 214 are designed to be as large as possible in their functional dimensions in order to maximize the number of laser sources processed by a given optical assembly, due to the cost advantages discussed earlier.

An output bundle comprising a plurality of beams 226 is passed through the slow axis focusing lens 164 into the multimode optical fiber 168 having the desired diameter and NA. The use of the cylindrical fast-axis optical assembly 230 accomplishes the dual function of focusing the fast axis direction 116 of each beam to the appropriate waist diameter and along with the previously described FAC lenses 180, directing the plurality of beams 226 to the appropriate NA for efficient coupling to multimode optical fiber 168 or other optical systems in a manner that preserves the brightness of the original laser diode emitting regions 100.

Turning now to the description of the remaining slow axis optical elements, in an exemplary embodiment illustrated in FIG. 5(d), after passing through the FAC lenses 180 the individual beams are collimated individually in the slow axis by the SAC lenses 184 after which they are gathered and additionally collimated in a bundle of columns 205 by relay lenses 196 which have a mild positive curvature. After passing through the cylindrical fast-axis optical assembly 230, the bundle of columns 204 is focused by slow-axis focusing lens 164 into the core 170 and within the acceptance angle 171 of the multimode optical fiber 168. Note that in the slow axis view of the exemplary embodiment shown in FIG. 5(d), there are three relay lenses 196, three slow-axis focusing lenses 164 and three multimode optical fibers 168 but only one bundle of columns 250 is shown for clarity. Both the relay lenses 196 and the slow-axis focusing lenses 164 may be chosen and sized to provide an optimum ratio of columns to rows based on the number of laser diodes in the stacked array 140. In this exemplary embodiment, there are six columns worth of beams being gathered and focused on the core 170 of each multimode optical fiber 168, providing substantially symmetric brightness at high efficiency with a minimal number of optical elements and high cost effectiveness.

It will be appreciated that for reasons of efficiency, aberration minimization, size, cost and complexity, many different optical collimating and focusing arrangements can be created with a wide array of optical technologies, including, but not limited to rod lenses, half-rod cylinders, gradient index lenses, meta-material optical elements and other multi-lens systems comprising a variety of optical elements. The inventive principles discussed above with respect to the exemplary embodiment shown in FIGS. 5(a)-(f) are applicable to a broad variety of optical collimating and focusing arrangements utilizing readily available lenses.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,")

unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A system for combining laser light sources, comprising:
   a stack of laser diode bar arrays, comprising two or more laser diode bar arrays, each laser diode bar array having multiple laser diodes;
   a multimode optical fiber; and
   a plurality of optical elements disposed between the stack of laser diode bar arrays and the multimode optical fiber, configured to direct light from the stack of laser diode bar arrays to the multimode optical fiber, the plurality of optical elements further comprising:
      a plurality of fast-axis collimating (FAC) lenses, wherein each laser diode bar array corresponds to one or more FAC lenses of the plurality of FAC lenses;
   wherein at least one FAC lens of the plurality of FAC lenses is misaligned with respect to its corresponding laser diode bar array, wherein a central optical axis of the at least one misaligned FAC lens is translationally or rotationally offset from a beam direction of its corresponding laser diode bar array, and wherein the at least one misaligned FAC lens has at least one of a translational position and an orientation relative to its corresponding laser diode bar array different from another FAC lens of the plurality of FAC lenses relative to the another FAC lens' corresponding laser diode bar array.

2. The system of claim 1, wherein the intensity of laser light reaching a core of the multimode optical fiber is higher with the at least one misaligned FAC lens being misaligned than what the intensity of laser light reaching the core of the multimode optical fiber would be if the at least one misaligned FAC lens was not misaligned.

3. The system of claim 1, wherein the plurality of FAC lenses include one or more gradient index lenses.

4. The system of claim 1, wherein the plurality of FAC lenses include one or more cylindrical optical elements.

5. The system of claim 1, wherein the stack of laser diode bar arrays includes a top laser diode bar, a laser diode bar in the middle, and a bottom diode laser bar;
   wherein FAC lenses corresponding to the top and bottom laser diode bars are misaligned more than an FAC lens corresponding to the laser diode bar in the middle, such that the optical centers of the FAC lenses in the fast axis direction corresponding to the laser diodes of the top and bottom laser diode bars are translationally offset further from the emitter centers of the laser diodes of their corresponding laser diode bar arrays than the optical center of the FAC lens in the fast axis direction corresponding to the laser diode bar in the middle, which is not misaligned or is relatively less misaligned.

6. The system of claim 1, wherein the at least one misaligned FAC lens is both translationally and angularly misaligned.

7. The system of claim 1, wherein the plurality of optical elements further comprise slow-axis collimating (SAC) lenses, each SAC lens corresponding to an individual laser diode.

8. The system of claim 1, wherein each of the plurality of FAC lenses is attached to its corresponding laser diode bar array.

9. The system of claim 1, wherein at least a portion of the diode laser emitters in the stack of laser diode bar arrays and the plurality of optical elements are configured to form a symmetric brightness unit that combines and shapes the output beams from the portion of the diode laser emitters and couples them into the core of the fiber such that the shaped and combined beams have a fast axis etendue and a slow axis etendue that are approximately equal to the etendue of the multimode fiber.

* * * * *